United States Patent [19]

Hutter

[11] Patent Number: 4,819,052
[45] Date of Patent: Apr. 4, 1989

[54] MERGED BIPOLAR/CMOS TECHNOLOGY USING ELECTRICALLY ACTIVE TRENCH

[75] Inventor: Louis N. Hutter, Richardson, Tex.

[73] Assignee: Texas Instruments Incorporated, Dallas, Tex.

[21] Appl. No.: 945,796

[22] Filed: Dec. 22, 1986

[51] Int. Cl.[4] .............................................. H01L 29/78
[52] U.S. Cl. ...................................... 357/49; 357/41; 357/55; 357/71
[58] Field of Search ...................... 357/49, 71, 34, 41, 357/55

[56] References Cited

U.S. PATENT DOCUMENTS 4,672,410   6/1987   Miura et al. .......................... 357/41

Primary Examiner—Robert S. Macon

Attorney, Agent, or Firm—Thomas R. FitzGerald; Leo N. Heiting; Melvin Sharp

[57] ABSTRACT

Disclosed is a structure and method of fabricating bipolar and MOSFET devices isolated by an electrically active trench. A doped epitaxial layer (24) is formed on semiconductor substrate (10). A trench (36) is formed through the epitaxial layer (24) down to the substrate (10). The trench (36) is filled with a conductive material (54) and a topside contact (182) is formed in electrical contact with the conductive trench. A bipolar transistor (176) is formed in the epitaxial area (38) on one side of the trench (36) and a MOSFET transistor (178) is formed in the epitaxial area (40) on the other side of the trench (36). Plural contacts (200–206) can be made to the top surface of the trench (186), thereby maintaining the underlying substrate (10) at a desired and uniform potential.

22 Claims, 6 Drawing Sheets

MERGED BIPOLAR/CMOS TECHNOLOGY USING ELECTRICALLY ACTIVE TRENCH

RELATED APPLICATION

"Deep Trench Isolation With Surface Contact To Substrate", by Louis N. Hutter et al., filed concurrently herewith, Ser. No. 745,942.

TECHNICAL FIELD OF THE INVENTION

The present invention relates in general to semiconductor structures and methods of fabrication thereof, and more particularly to the integration of bipolar and CMOS technologies utilizing trench isolation techniques.

BACKGROUND OF THE INVENTION

The large scale integration of semiconductor circuits into a smaller wafer area is generally accompanied by numerous problems. First, the circuits themselves must be scaled or reduced in size so that less wafer area is utilized. For circuits employing the MOSFET technology, the geometric pattern of the masks used in fabricating the circuits can be reduced in size to the extent permitted by current photolithographic techniques. For bipolar transistors, the geometric mask patterns can be reduced in size only to a certain degree because of performance limitations imposed by reduced spacing of the transistor semiconductor regions. Such restrictions limit the severe scaling of bipolar devices, as such type of devices are not surface-operating devices like those of the MOSFET technology. Rather, the operation of bipolar transistors depend on the depth of the transistor semiconductor regions.

A second concern in the large scale integration of circuits is the electrical isolation which must be provided between the various circuits on the wafer. Traditionally, electrical isolation of adjacent circuits was provided by either collector diffused isolation technology, or standard buried collector techniques. Oxide isolation and oxide trench isolation techniques are now commonly employed with MOSFET circuits to provide such electrical isolation. In combining the bipolar and MOSFET semiconductor technologies, the junction isolation technique is wasteful of wafer area, and the attempt to use oxide isolation in bipolar circuits makes substrate biasing difficult. Bipolar circuits, and especially analog circuits utilizing PNP transistors require a substrate contact. When using either field oxide or trench oxide isolation techniques, contact to the substrate has conventionally been made to the backside thereof. Backside processing of wafers requires special packaging techniques, including alloy mounting of the chip to a header to insure adequate substrate contact. The increased product costs attendant with backside processing are apparent.

An additional problem encountered in using oxide trench isolation in bipolar circuits is the parasitic MOSFET device which can be formed by such isolation process, wherein the trench isolation itself forms the gate oxide of the parasitic MOSFET device. With the input of the parasitic device located on one side of the isolation trench, and with the output thereof located on the other side, the electrical isolation provided by the trench may be reduced or even negated.

From the foregoing, it can be seen that a need exists for an improved isolation technique compatible with the fabrication techniques of both the bipolar and MOSFET technologies. An associated need exists for a trench isolation technique which also permits substrate contact to the top side of the wafer, and which functions as a shield to reduce or eliminate the parasitic MOSFET devices.

SUMMARY OF THE INVENTION

In accordance with the present invention, the disclosed fabrication technique for merging bipolar and the MOSFET technology reduces or substantially eliminates the disadvantages or shortcomings associated with the prior art techniques. According to the fabrication methods and the resulting structure of the invention, an electrically active isolating trench is utilized for separating semiconductor circuits, and wherein the fabrication of the trench is compatible with both the bipolar and MOSFET fabrication techniques.

With regard to the preferred form of the invention in which an exemplary NPN bipolar transistor and N-channel MOSFET device are fabricated, a pair of N+ buried layers are formed on a P-type semiconductor substrate. An epitaxial layer of N-type semiconductor material is deposited on the substrate, covering the buried layers, and provides the semiconductor material in which the bipolar and MOSFET devices are subsequently fabricated. A thin layer of silicon dioxide (hereinafter silicon oxide) is grown over the surface of the wafer, followed by a deposition of silicon nitride, and thereover a much thicker layer of deposited silicon oxide.

The wafer is then masked and patterned to define the lateral geometry of a trench opening, whereupon the thick oxide, the nitride, and the underlying thin silicon oxide are etched downwardly through the mask opening, and through the epitaxial material into the underlying substrate. A thin layer of silicon oxide is first formed on the sidewalls of the trench, and thereafter covered with a nitride layer which merges with the previously deposited nitride layer. The bottom of the trench is etched to expose the underlying substrate, and the trench is filled with polycrystalline silicon (hereinafter sometimes polysilicon) and doped to form an electrically active trench in electrical contact with the underlying substrate.

The wafer is then masked and patterned to respectively form a P-well in the MOSFET wafer area, and an N+ semiconductor region forming a collector region in the bipolar area. The wafer is heated to thereby drive the N+ impurity downwardly into contact with the buried layer in the bipolar wafer area. A P-type implant is conducted to form the base region in masked bipolar transistor areas of the wafer. Inverse moat areas of the wafer are masked and patterned and implanted with an N-type impurity, and oxidized to form thick field oxide insulation regions with the P-type impurity diffusing thereunder and forming channel stops in both the bipolar and MOSFET transistor areas.

Previously grown oxides in the inverse moat areas are then removed and a thin layer of new oxide is grown thereover to form the gate oxide of the MOSFET transistors. A blanket or selective threshold implant is made to adjust the threshold voltages of the MOSFET devices. A layer of doped polysilicon is deposited over the surface of the wafer and patterned to form MOSFET gate conductors, as well as the bottom electrode of an exemplary semiconductor capacitor. An additional thin layer of silicon oxide is formed over the polysilicon, thereby defining the insulator of the capacitor. A second layer of doped polysilicon is deposited on the wafer and masked and patterned to define the top plate of the semiconductor capacitor.

After appropriate masking and patterning of the bipolar and N-channel MOSFET transistor regions, an N-type implant is conducted to form the emitter region within the semiconductor base region of the bipolar transistor, and at the same time source and drain regions in the NMOS transistor area. The collector region of the bipolar transistor may also be implanted to form a highly-doped interface for metallic connection. Additional masking and patterning of the bipolar and NMOS transistor areas define corresponding base and backgate contact locations. The wafer is then implanted with a heavy dose of a P-type impurity to form such semiconductor locations.

Subsequent insulation, metallization and overcoat processing is conducted to form contacts to the various semiconductor regions of the bipolar and MOSFET devices, and protection from the environment. A metallization matrix pattern can be formed over the electrically active trenches to provide multiple topside substrate connections. As a result, the substrate is maintained at a ground potential at many locations, thereby reducing the debiasing effect predominent in high current circuits.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts, areas and regions throughout the views, and in which.

DETAILED DESCRIPTION OF THE INVENTION

Figure 1:
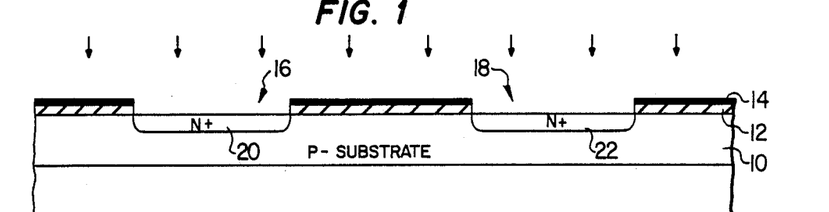
FIGS. 1-9 illustrate the steps in fabricating an electrically active trench separating the bipolar and MOSFET transistor circuits.

The fabrication of the invention is commenced by preparing a <100> silicon wafer 10 having a nominal 10–15 ohm-cm conductivity. A layer 12 of thermal silicon oxide is formed on the substrate 10 with a thickness of about 6000–7000 angstroms. Deposited over the oxide layer 12 is a layer 14 of photoresist material. The photoresist material 14 is patterned to define openings 16 and 18 corresponding respectively to a bipolar transistor area and an NMOS transistor area. While the invention is described herein with regard to the fabrication of an NPN bipolar transistor, an NMOS transistor and a semiconductor capacitor, many other semiconductor devices could be formed as well. For example, and in actual practice, a number of PMOS transistors would also be formed with NMOS transistors to form a CMOS transistor pair.

The wafer is subjected to an ion implant, wherein an N-type impurity is implanted into the substrate 10 to form doped regions 20 and 22. These regions 20 and 22 will form the buried regions for the respective bipolar and NMOS transistor devices. The implant can be effected using antimony with a dosage of about 2E15 ions/cm$^2$. The wafer is heated to a temperature of about 1250°–1300° Centigrade to drive the antimony impurity further into the substrate 10, and to lower the sheet resistance of the regions 20 and 22 to about 15–20 ohm/square. The wafer processed thus far appears as shown in FIG. 1.

The photoresist mask 14 and silicon oxide layer 12 are removed, and a single-crystal epitaxial layer of silicon 24 is deposited over the substrate 10, covering the N+ semiconductor regions 20 and 22. The epitaxial layer 24 of silicon is doped with an N-type impurity at a level of about 1E15 atoms/cm$^3$. The silicon material of the epitaxial layer 24 assumes the <100> crystal orientation similar to that of the substrate 10. A 500 angstrom thick pad oxide 26 is thermally grown on the exterior surface of the epitaxial layer 24. A 1100 angstrom thick layer of silicon nitride ($Si_3N_4$) 28 is then deposited over the surface of the pad oxide 26. The silicon nitride can be deposited using a conventional low pressure chemical vapor deposition (LPCVD) process.

A thick layer 30 of silicon oxide is deposited on the silicon nitride layer 28, with a nominal thickness of about 15,000 angstroms. The silicon oxide layer 30 may be deposited using tetraethoxysilane (TEOS) using conventional silicon oxide deposition processes. The deposited silicon oxide 30 functions as a sacrificial layer of material which is consumed during subsequent etching processes, and thereby protects underlying material from the etching process. Particularly, the deposited silicon oxide 30 functions as an etch mask for providing the electrically active trench of the invention. For trenches of about 8–10 microns deep, the deposited silicon oxide 30 should be of a thickness as noted above. For deeper trenches, the thickness of the deposited oxide 30 should be correspondingly greater.

Figures 2, 3:
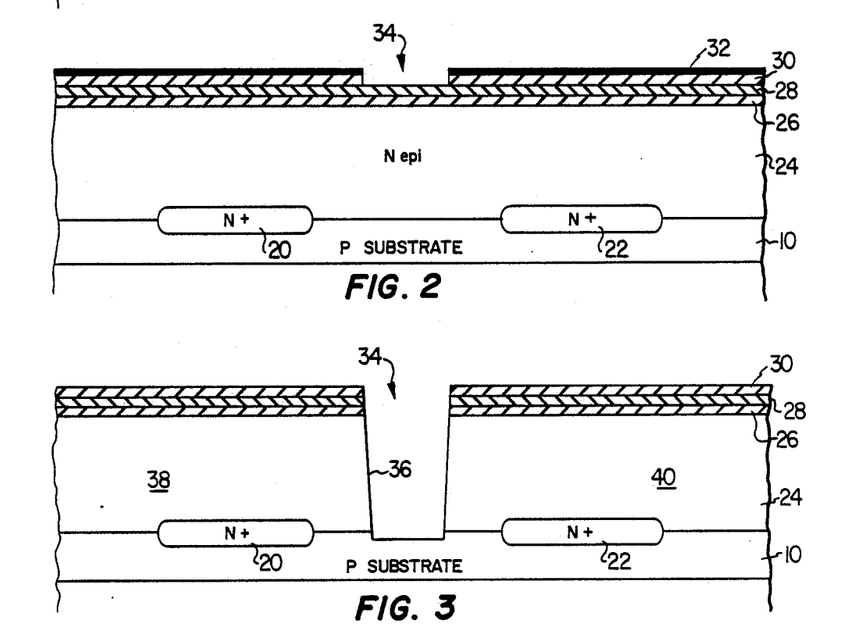

A photoresist material 32 is next spun or otherwise spread over the surface of the wafer and patterned to define an opening 34 for a trench. The opening 34 should preferably be narrow to reduce the wafer area used for isolation. In the preferred embodiment, the mask opening 34 is 2–3 microns wide. While the cross-sectional view of FIG. 2 illustrates a single trench opening 34, a top view of the trench might assume an annular or square configuration for isolating a circuit located therein from adjacent circuits formed outside the trench. A stack etch is performed, wherein the deposited oxide 30, the nitride layer 28, and the thin thermally grown oxide 26 defined by the opening 34 are removed down to the surface of the epitaxial layer 24. The stack etch can be accomplished using conventional plasma etching techniques.

After the stack etch, the photoresist mask layer 32 is removed, and the thick deposited silicon oxide layer 30 provides a sacrificial etch mask for the subsequent trench formation in the epitaxial material 24. A second etch is performed on the wafer for removing the epitaxial material underlying the opening 34. A dry plasma etch can be utilized for removing the epitaxial material down to, and into the P-substrate 10, as shown in FIG. 3. As noted above, the trench 36 defines a bipolar transistor area 38 in the epitaxial layer 24, and an NMOS transistor area 40, also in the epitaxial layer 24. Another trench may be comparably formed between the NMOS transistor region 40 and a PMOS transistor region (not shown).

As noted above, the trench may be only 2–3 microns wide, thereby utilizing very little wafer area, and allowing a high packing density of circuits on the wafer. Moreover, and to be described in more detail below, the semiconductor areas of the respective bipolar transistor and NMOS transistor can be formed in abutment against the trench 36 without concern of the formation of parasitic transistor elements, as was common with the oxide isolated trenches known in the art.

After forming the trench 36 using dry etch techniques, it may be necessary to remove any silicon oxide deposits that may have formed on the trench sidewalls as a result of the displacement of small deposits of the deposited silicon oxide 30 due to the impact of the plasma atoms thereon. The displaced silicon oxide material 30 accumulated on the trench sidewalls may be removed by a conventional semiconductor deglazing process.

Figure 4:
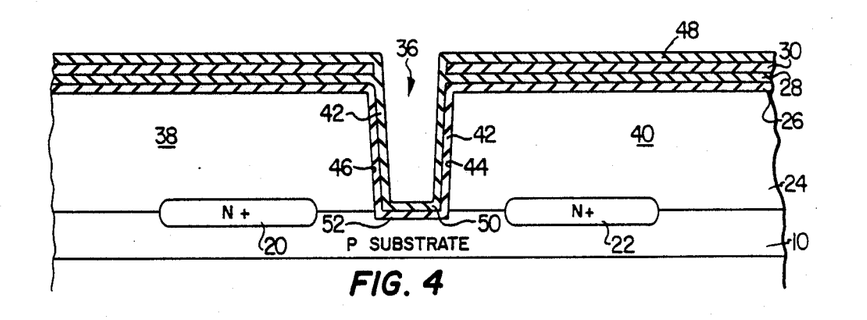

Turning now to FIG. 4, the wafer is then subjected to an oxidizing environment in which a thin layer of silicon oxide 42 is grown on the sidewalls 44 and 46 of the trench, as well as on the bottom of the trench. The silicon oxide 42 is grown to a thickness of about 500 angstroms. An additional silicon nitride layer 48 is then deposited over the surface of the wafer, covering the trench sidewall oxide 42. The second silicon nitride layer 48 merges or links with that of the first layer 28, forming a homogenous silicon nitride structure. As noted in the co-pending application, the silicon nitride layers 28 and 48 provide oxidation protection to the upper trench corners, thereby alleviating the formation of epitaxial layer crystal dislocations during subsequent oxidation processing.

An additional stack etch is conducted by a plasma or similar technique, which is effective to remove wafer material in a downward direction. As a result, the top nitride layer 48 and the underlying remaining part of the deposited oxide 30 are removed, together with the silicon oxide 50 and silicon nitride 52 located at the bottom of the trench 36. The silicon nitride 48 and the oxide 42 deposited on the trench sidewalls 44 and 46 is not removed by the anisotropic etch. With this processing step, the P-type substrate 10 is exposed at the bottom of the trench 36, and now constitutes the bottom thereof.

Figure 5:
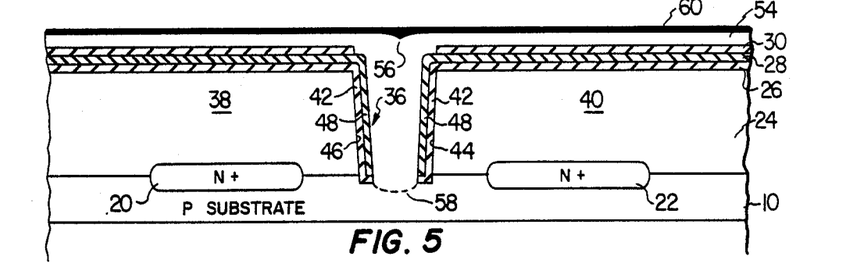
Figure 6:
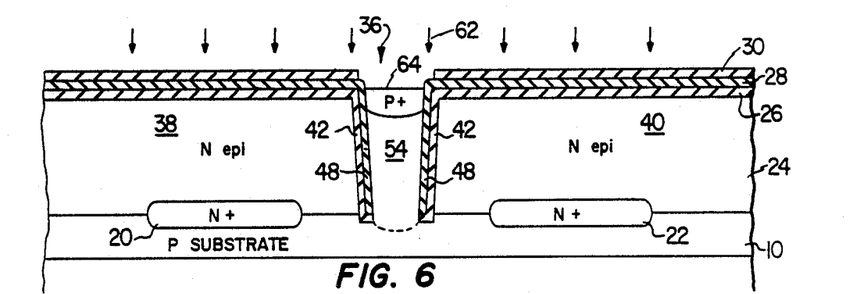

With regard to FIG. 5, a layer 54 of polycrystalline silicon is deposited over the surface of the wafer. The polycrystalline silicon 54 is conformal and thereby forms a cusp 56 at the top of the trench 36. Importantly, the polycrystalline silicon is formed in contact with the P-type substrate 10, as shown by dotted line 58. The polycrystalline silicon 54 is planarized by spinning a layer of photresist material 60 over the surface of the wafer. As noted by FIG. 5, the photoresist 60 is not conformal, and thereby fills in the cusp 56. Preferably, the photoresist material 60 is of the type having the same etch rate as that of the polycrystalline silicon 54, whereby an etching process removes the entire photoresist layer 60, the polycrystalline silicon 54 extending laterally on the surface of the wafer, and the cusp 56. All the polycrystalline silicon which remains is that which initially filled the trench, as shown in FIG. 6.

A heavy dose of a P-type impurity is implanted 62 into the wafer, thereby forming a highly doped area 64 within the polycrystalline material 54 of the trench 36. Subsequent processing steps are effective to diffuse the P-type impurity 64 further down into the polysilicon 54 to form electrical continuity between the P-substrate 10 and the trench polysilicon 54. In the alternative, a doped in situ polysilicon can be deposited within the trench 36 without a subsequent impurity implant or diffusion.

The remainder or remnant of the deposited silicon oxide 30 forming the sacrificial mask is then stripped from the wafer. The wafer is subjected to a silicon oxidizing environment, whereby a layer of oxide 65 is grown over the polysilicon material 54 of the trench 36. The oxide cap 65 is formed in a conventional manner in which a portion of the trench polysilicon 54 is consumed in forming such oxide cap 65. The trench P+ impurity 64 is driven downwardly somewhat by the oxidation heating of the wafer.

Figure 7:
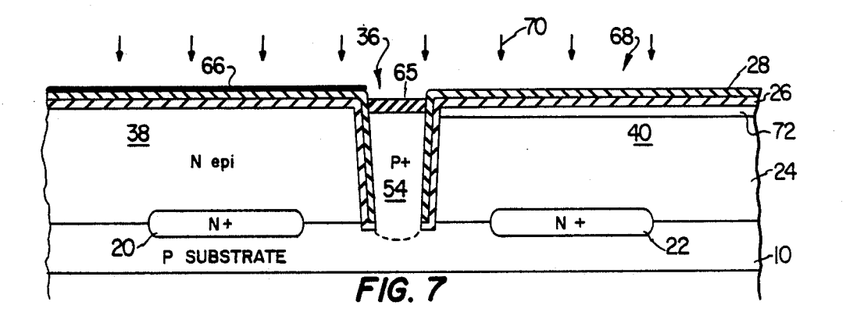

As shown in FIG. 7, a layer 66 of photoresist material is spread over the surface of the wafer and patterned to define an area 68 for forming a P-type well, such as needed for N-channel transistors. An implant 70 is conducted over the surface of the wafer, thereby forming a P-well 72 in the epitaxial region 40. The P-well implant is conducted by using boron at a dosage of about 10E13 ions/cm$^2$ and energy of 100–150 KEV. The polysilicon trench material 54 may also be implanted during this step with the P-type impurity without consequence.

Figure 8:
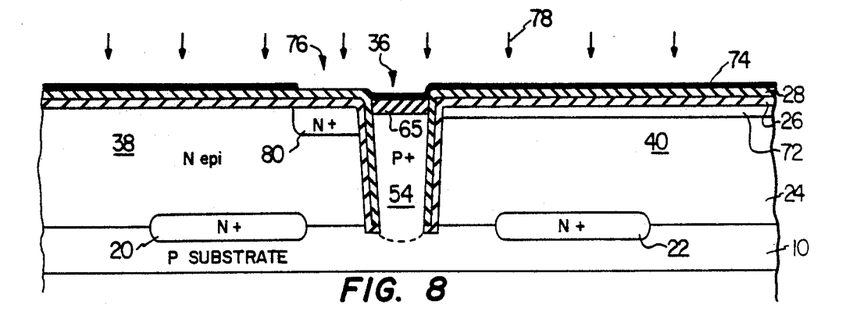
Figure 9:
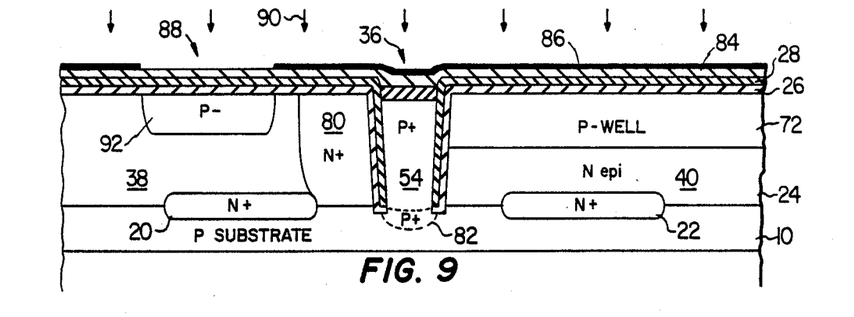

The photoresist mask 66 is removed (FIG. 8) and a subsequent layer 74 of photoresist material is spread over the surface of the wafer. The photoresist 74 is patterned to define an opening 76 corresponding to a bipolar transistor collector area. The bipolar transistor collector implant 78 forms a doped N+ region 80 in the bipolar transistor epitaxial area 38. A heavy dosage 5E15 to 1E16 of phosphorus is employed as the collector implant, and conducted at an energy lever of about 150–200 KEV. The wafer is then heated sufficiently to drive the N-type impurity in the collector region 80 downwardly into contact with the heavily doped buried layer 20. The N-type impurity forming the semiconductor region 80, being of a high concentration, diffuses downwardly faster than the impurity forming the P-well 72. As depicted in FIGURE 9, the P-type impurity forming the conductivity of the trench polysilicon 54 diffuses quickly downwardly due to the high diffusion coefficient of polysilicon. As a result, by elevating the temperature of the wafer, the P-well 72 diffuses downwardly somewhat, while the P+ polysilicon 54 and the N+ collector area 80 diffuse downwardly into contact with the P-substrate 10.

FIG. 9 illustrates the structure of the wafer processed thus far according to the foregoing steps. As noted, P-type impurities of the trench 36 have formed a heavily doped P+ area 82 within the P-substrate 10. This provides a highly conductive interface with the substrate 10 which is also characterized by a P-type impurity.

In accordance with the invention, an additional nitride layer 84 is deposited over the surface of the wafer. Nitride layer 84 is deposited with a thickness of only about 500 angstroms so that the composite nitride layer formed by layers 28 and 84 is not overly thick, thereby causing potential wafer stress problems. A layer of photoresist material 86 is spread over the surface of the wafer and patterned to define an opening 88 for forming a bipolar transistor base region in the underlying epitaxial region 38. The wafer is then implanted 90 with a P-type impurity, such as boron, to form a lightly-doped transistor base region 92. The base implant is conducted at about 100-150 KEV, with a dosage of 5E13 to 1E14. The structure of the wafer appears as shown in FIG. 9. After removing the photoresist 86, the wafer can be heated to diffuse the base region 92 downwardly.

Figure 10:
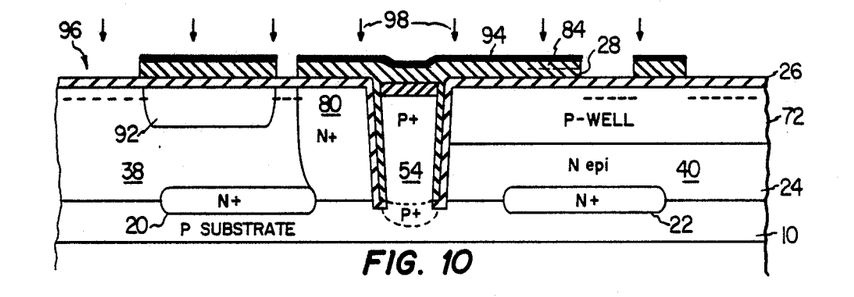
FIGS. 10-19 illustrate the various processing steps in fabricating bipolar and MOSFET transistors, as isolated by the electrically active trench.

The wafer is next prepared for forming inverse moat areas defining locations which will be covered with a thick field oxide. FIG. 10 illustrates the processing step in which a layer 94 of photoresist material is spread over the surface of the wafer, and patterned to define openings, such as 96. The nitride 84 exposed in the opened areas 96 is removed by a conventional dry etch process. Phosphorus is then implanted 98 into the wafer forming the N-type surface regions, such as 100. A low dosage of phosphorus, such as 1E12 ions/cm$^2$, can be employed to form the lightly doped regions. In accordance with the self-aligning aspect of the invention, the phosphorus impurity 98 is also implanted into the NMOS transistor areas, even though this type of impurity is undesired in such transistor regions. Subsequent P-type doping in the NMOS transistor regions will counterdope the undesired N-type impurity, thereby achieving the correct conductivity type of material.

Figure 11:
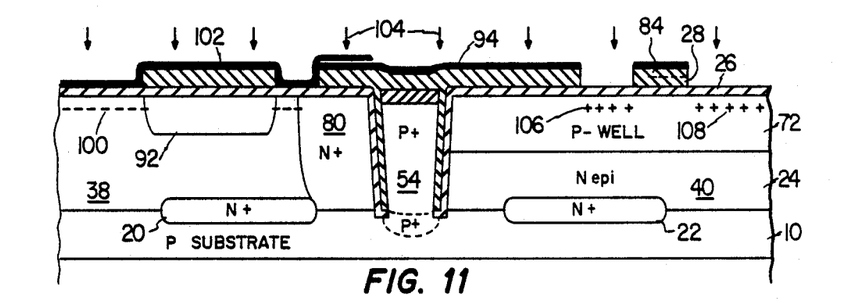

IN FIG. 11, yet another photoresist layer 102 is spread over the surface of the wafer, covering the previously opened areas over the bipolar transistor area 38, as well as over the PMOS transistor area (not shown). A boron implant 104 is effective to counterdope the shallow N-type regions to form P-type impurity regions 106 and 108. The implant 104 can be conducted at a dosage of about 1E13 ions/cm$^2$. The photoresist layers 94 and 102 are then removed.

Figure 12:
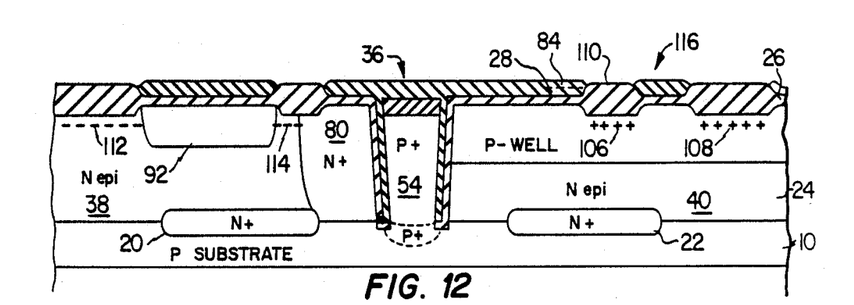

The wafer is subjected to an oxidizing environment for growing a thick field oxide in predetermined areas, except those covered by the original silicon nitride layer 28. As illustrated in FIG. 12, the silicon material not underlying the nitride 28 is consumed, thereby growing thick oxide regions, such as identified by the reference number 110. The growth of the thick field oxide 110 is conducted at about 900° C. in the presence of steam. This type of environment is especially suitable for growing thick silicon oxides in a relatively short period of time. A 10,000-15,000 angstrom thick layer of silicon oxide 110 provides sufficient surface isolation between desired devices. The impurity regions 106 and 108 underlying the thick oxide 110 provide a channel stop for isolating adjacent circuits. Channel stop areas 112 and 114 underlie similar thick field oxide regions in the bipolar transistor area 38. The wafer area 116 will comprise the backgate of the NMOS transistor, which will also include a semiconductor region formed in the epitaxial region 40.

After the high temperature processing to form the field oxide, the nitride layer 28 is no longer necessary, and thus it is stripped from the wafer. Since no further extensive silicon oxide formation will be formed in the area of the trench 36, the risk of silicon crystal dislocations is reduced. The original thin layer of silicon oxide 26 is also removed by a conventional deglazing process, and is replaced by a dummy or sacrificial gate oxide (not shown). The sacrificial oxide is only about 250-800 angstroms thick, and is for the purpose of transforming any nitride residue into a corresponding oxynitride, thereby eliminating the Kooi white-ribbon effect. Another deglazing process is conducted in which the sacrificial oxide and oxynitride are removed.

Figure 13:
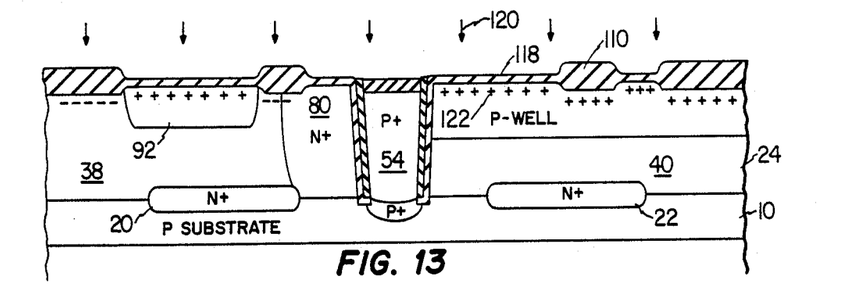

A high quality gate oxide 118 is then grown on the surface of the wafer, over the bipolar transistor region 38, the NMOS region 40 and the backgate region 116. The gate oxide 118 is grown to a desired thickness, depending upon the particular circuits to be merged. A typical gate oxide thickness may range from 400-1000 angstroms. As shown in FIG. 13, a blanket implant 120 of boron is made over the surface of the wafer to provide a threshold voltage for the NMOS and PMOS transistors. The implant impurity is shown as plus symbols 122, which also exist in the base region 92 of the bipolar transistor area 38.

Figure 14:
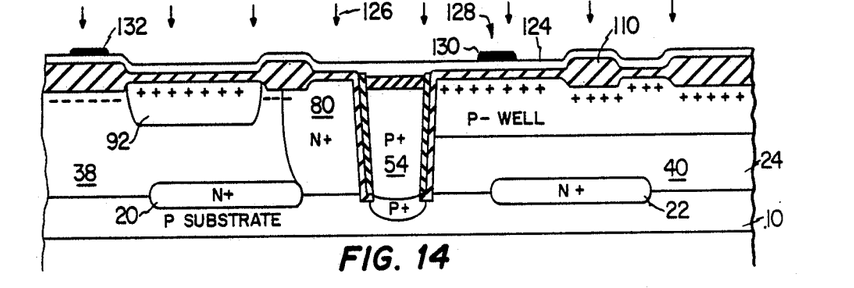

FIG. 14 illustrates the next step of the fabrication process of the invention in which a first layer 124 of polycrystalline silicon is deposited over the surface of the substrate to a thickness of about 5,000 angstroms. The polysilicon 124 is implanted to form a highly doped polycrystalline silicon 124 suitable for forming MOSFET gate conductors, as well as semiconductor capacitor plates. A photoresist layer 128 is next spread over the wafer, and patterned to form pads 130 and 132. The doped polycrystalline silicon underlying these photoresist pads 130 and 132 will form respectively an NMOS transistor gate conductor and the lower capacitor plate of a semiconductor capacitor.

Figure 15:
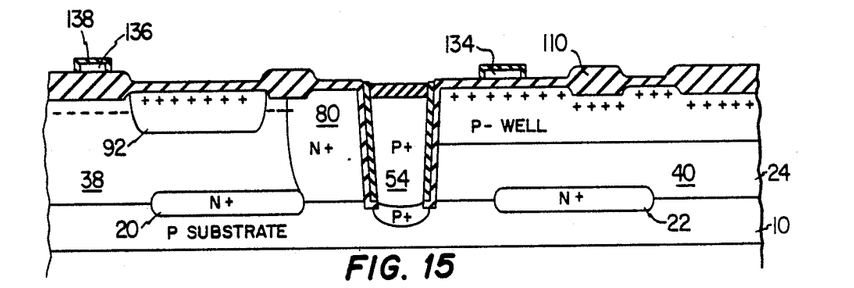

FIG. 15 depicts the NMOS transistor gate conductor 134 and the lower plate 136 of the semiconductor capacitor. The wafer is oxidized in a silicon oxidizing ambient, whereby a thin layer 138 of silicon oxide is grown on the doped polycrystalline silicon pads 134 and 136. The silicon oxide layer 138 forms an interlevel oxide comprising a dielectric for a semiconductor capacitor. The oxide may be 800-1,000 angstroms thick. Other dielectric materials, or compositions thereof, such as silicon nitride and silicon oxide can also be utilized.

Figure 16:
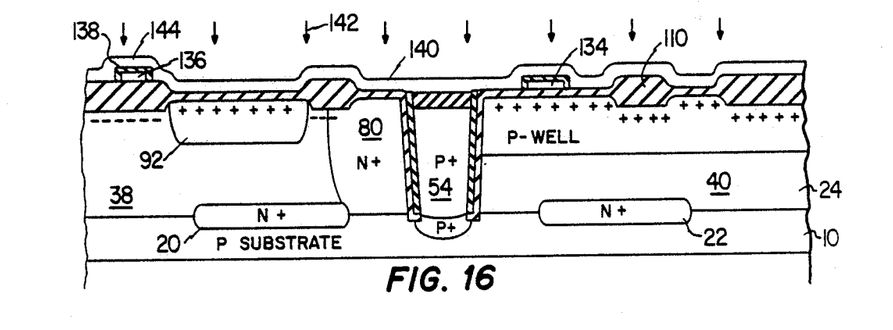

As illustrated in FIG. 16, an additional layer 140 of polycrystalline silicon is deposited over the surface of the wafer, and implanted 142 to provide a conductive top plate 144 for the semiconductor capacitor. The polycrystalline silicon is deposited to a depth of about 5,000 angstroms, and implanted with an N-type impurity to render the polysilicon 140 conductive. A photoresist mask (not shown) is spun over the surface of the wafer and patterned to define the top plate 144 of the capacitor. The wafer is subjected to an etch to remove the majority of the polycrystalline silicon 140, except for the top capacitor plate 144. As noted in FIG. 16, the top capacitor plate 144 is electrically insulated from the bottom capacitor plate 136 by the thin dielectric insulation 138. While not shown, the NMOS transistor region 40 can be masked, patterned and implanted to form lightly doped source and drain regions to counteract the hot electron effect.

Figure 17:
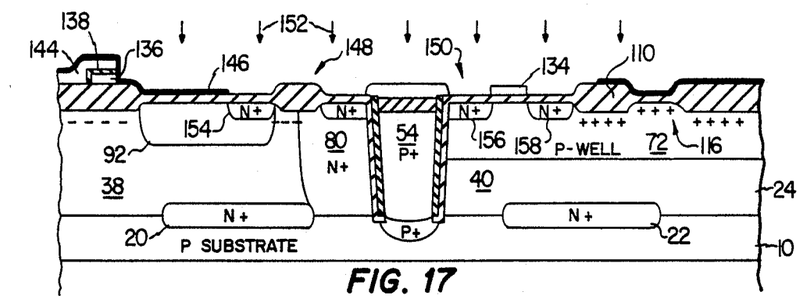

With regard to FIG. 17, a photoresist layer 146 is spun over the wafer and patterned to form an opening 148 in the bipolar transistor area 38, and an opening 150 over the P-well of the NMOS transistor area 40. The wafer is implanted with an N-type impurity to form a bipolar transistor emitter region 154, and NMOS transistor source and drain regions 156 and 158. The implant 152 is conducted with an arsenic dosage of about 1E16 ions/cm$^2$, and at an energy of about 50 KEV. Because of the crystal damage accompanied by the heavy ions of the arsenic implant, the wafer is annealed for about 30 minutes at a temperature of about 1,000° C., after the photoresist material 146 has been removed from the wafer.

Figure 18:
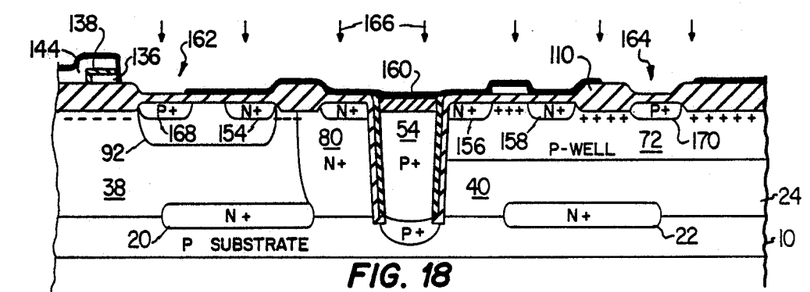

With regard to FIG. 18, the wafer is again masked with a photoresist layer 160, and patterned to define an opening 162 above the base region 92 of the bipolar transistor, and an opening 164 in the backgate region of the NMOS transistor area 40. While not shown, areas in the photoresist mask 160 are opened in the PMOS transistor (not shown) to define respective source and drain regions. Boron, or another similar P-type impurity is implanted 166 into the wafer to form an extrinsic P+ bipolar transistor base region 168 and a backside gate region 170. The implant 166 is conducted with a dosage of about 5E15 ions/cm$^2$ and energy of about 50 KEV. The photoresist mask 160 is removed and the wafer is oxidized to form a thin barrier layer of silicon oxide (not shown) to prevent counterdoping of the transistor regions by the subsequence formation of doped material thereover. A barrier oxidation thickness of about 500 angstroms is sufficient to form the counterdoping barrier. The temperature with which the wafer is subjected to grow the barrier oxide also anneals damage caused by the previous implant steps.

Figure 19:
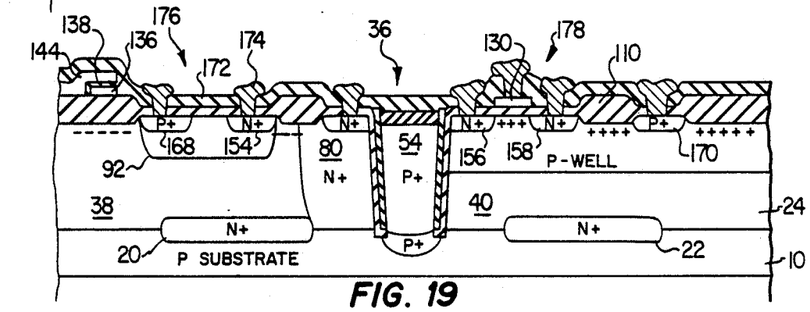

FIG. 19 illustrates the completed wafer after having undergone conventional metallization steps in forming electrical conductors and contacts to the various active semiconductor regions of the wafer. Contacts to the conductive polysilicon, such as the capacitor plates 136 and 144, and the MOSFET gate conductors 130 are made in a comparable manner. The capacitor plate contacts are not shown. Particularly, a phosphorous silicate glass 172, or similar material is spread over the wafer and patterned to form openings to the semiconductor regions of the various transistors. The silicate glass 172 is then reflowed at a temperature of about 950° C. in a steam or inert gas ambient to form a smooth topside topography for the wafer. The silicate glass layer 172 is formed sufficiently thick to reduce capacitance between the overlying metallization and the underlying polysilicon conductors. The openings in the silicate can be formed therethrough, as well as through the gate oxide layer to the various semiconductor regions.

A conductive metal 174, such as aluminum, titanium, tungsten, paladium, or other suitable metal, is then deposited over the surface of the wafer. The metal layer is masked by a photoresist, and etched to form a desired metallization pattern innerconnecting various transistors together to form the merged bipolar and CMOS transistor arrangement of the invention. A compressive nitride layer (not shown) is deposited over the metallized interconnect pattern as a protective overcoat. Environmental as well as physical damage to the wafer is thus prevented. During deposition of the compressive nitride the metal-semiconductor interface is sintered, thereby providing a high quality electrical connection therebetween. The compressive nitride is also masked and etched to define openings to bond pads of the wafer so that external electrical connection can be made to the circuits of the wafer.

FIG. 19 is illustrative of the first embodiment of the invention, wherein an electrically active trench 36 is formed between an exemplary bipolar transistor 176 and an MOS transistor 178. The conductive polysilicon material 54 filling the trench 36 provides electrical isolation, as well as an electrical shield, between the transistor devices 176 and 178. As noted above, the conductive polysilicon material 54 of the trench 36 is electrically connected to the wafer substrate 10. As a result, the voltage potential to which the substrate 10 is connected, also exists on the trench refill material 54. Thus, and in contrast with the prior trench oxide isolation techniques, electrostatic circuit voltages which may appear on one side of the trench are not capacitively coupled therethrough to influence circuits on the other side of the trench 36. Parasitic MOSFET devices which may accompany conventional oxide-filled trenches are thereby substantially reduces or eliminated by the electrically active trench of the invention.

The components of a typical parasitic P-channel device include a gate conductor formed by the heavily doped collector region 80 of the bipolar transistor 176. A conventional oxide-filled trench would provide the gate oxide of the parasitic device. The N-type epitaxial layer 24 and the N+ region 156 would correspond to the source and drain regions of the parasitic device. The P-well 72 would form the conduction channel which would invert when a voltage is applied to the parasitic gate conductor formed by the bipolar transistor collector 80. However, with the present invention, when the substrate 10 it grounded, as it conventionally would be, any parasitic electrical action across the trench 36 would be eliminated.

Figure 20:
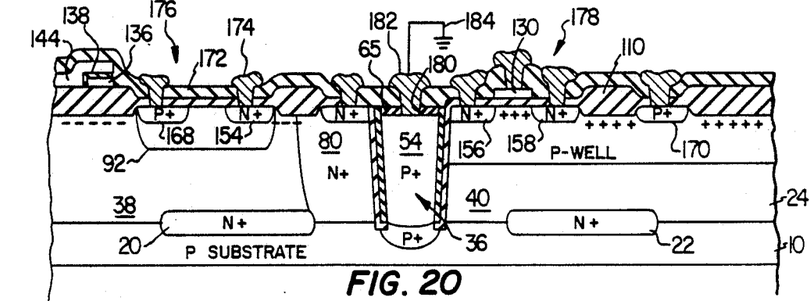
FIG. 20 is a sectional view of a portion of a semiconductor wafer illustrating an electrically active trench for providing a topside substrate connection.

FIG. 20 illustrates another embodiment of the invention, wherein a topside substrate connection is provided. In this alternate form of the invention, an opening 180 is defined in the silicon oxide layer 65 which caps the top of the trench polysilicon 54. A similar opening is formed through the silicate glass layer 172 for providing access through the oxide opening 180 to the underlying trench polysilicon 54. Formed concurrently with the metallization pattern of the integrated circuit is a contact electrode 182 which is in electrical contact with the substrate 10 through the conductive trench polysilicon 54. Accordingly, any electrical potential applied to electrode 182 is correspondingly applied to the substrate 10. In a majority of integrated circuit applications, the electrode 182 of the electrically active trench 36 will be grounded, as is shown schematically by reference character 184. Of course, the trench electrode 182 can be connected to positive or negative voltage to bias the semiconductor substrate 10 to a corresponding positive or negative potential.

The provision of a topside substrate electrode 182 allows electrical connections to be made to the underlying substrate, and at any desired locations on the top surface of the wafer. With the provision of the present invention, a substrate ground potental, for instance, can be maintained or reestablished throughout the wafer by forming a plurality of substrate electrodes 182 atop desired locations of corresponding electrically active trenches. This is especially important in high current circuits where the voltage drop across the sheet resistance of the semiconductor substrate material can become appreciable. This voltage drop is undesirable, and when it approaches about 0.6–0.7 volts in bipolar transistor circuits, various junctions can become forward biased and thus disturb the otherwise normal operation of the transistors. Essentially, when large currents are required to flow through the semiconductor substrate 10, the voltage at various points therethrough may be different, even though the substrate is connected to ground at a remote location.

Figure 21:
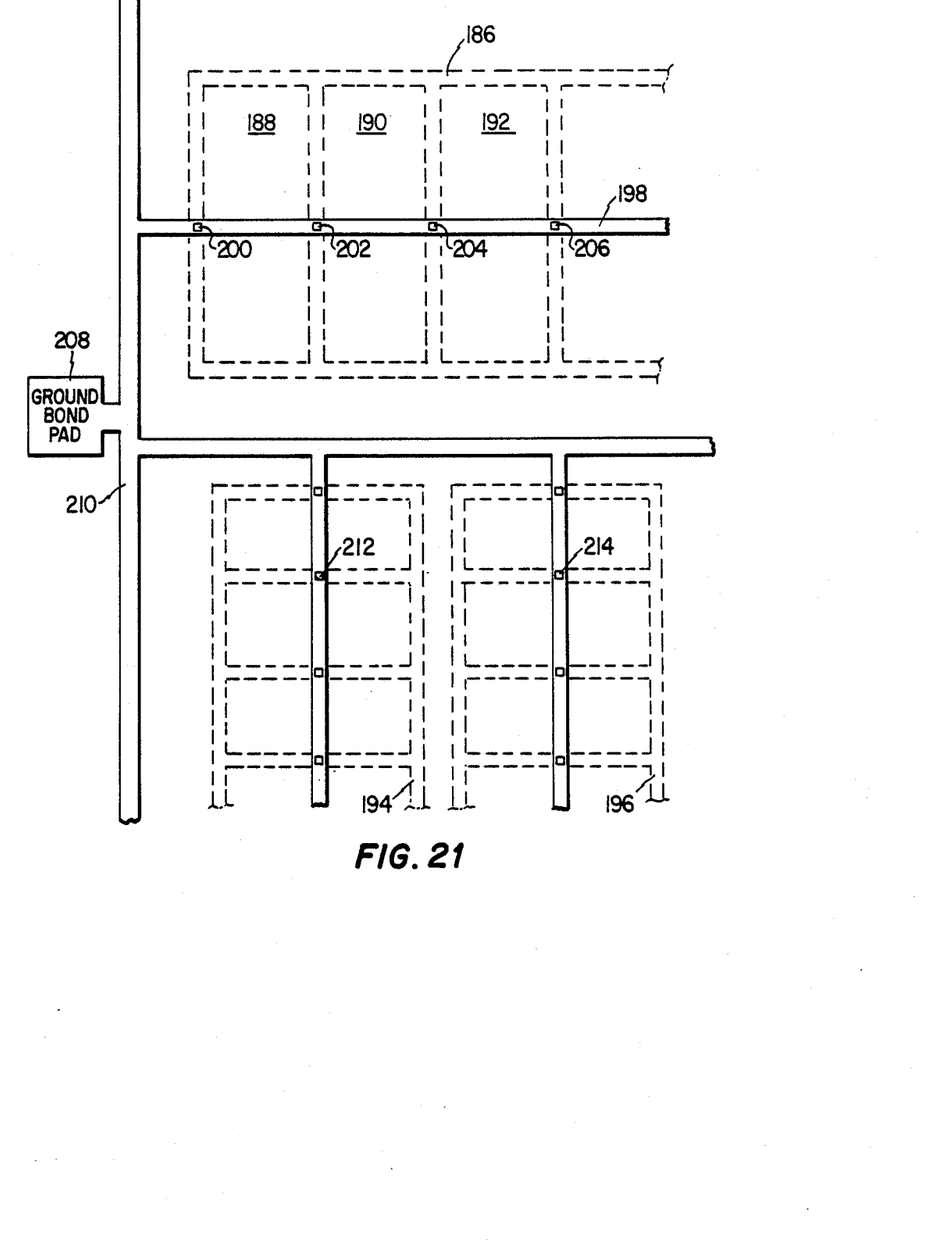
FIG. 21 illustrates a topside substrate interconnecting pattern to reduce the debiasing effects of high current circuits.

FIG. 21 illustrates a top view of a circuit layout embodying the electrically active trenches of the invention. An electrically active trench network 186 is shown isolating semiconductor areas 188–192. Electrically active trenches 194 and 196 provide electrical isolation for similar semiconductor areas. For purposes of illustration, the trenches 186, 194 and 196 are connected together by a common topside conductor 198. In order to maintain the underlying substrate (not shown) at a uniform potential, the ground conductor 198 is formed overlying the trench 186, and is connected thereto by topside electrodes 200-206. The ground conductor 198 is connected to a ground bond pad 208 which, in the example, can be connected to a circuit ground potential. The ground bond pad 208 is branched by a conductor 210 to other electrically active trenches 194 and 196 which are connected thereto by corresponding topside electrodes 212 and 214.

The technical advantage provided by plural topside substrate contacts is apparent in high current carrying semiconductor circuits. With the provision of plural substrate contacts, a corresponding plurality of current paths are provided such that the substrate does not experience appreciable voltage drops. Moreover, the metalization pattern of the ground conductors need not be symmetrical with respect to the trenches 186, 194 and 196 as shown in FIG. 21, but rather additional contacts can be formed at locations on the trench where substrate debiasing problems are acute.

TECHNICAL ADVANTAGES OF THE INVENTION

From the foregoing, disclosed is a semiconductor structure, and a method of fabrication thereof, for integrating bipolar and field effect circuits with an improved electrical isolation. One technical advantage presented by the present invention permits the fabrication of bipolar devices, MOSFET devices and isolation trenches utilizing common processing steps and conventional silicon processing techniques. Another technical advantage provided by the invention allows the fabrication of the isolation trenches generally prior to that of the transistor devices, while yet minimizing the risk of crystal faults and dislocations adjacent the trench corners. Yet another technical advantage of the invention permits the reduction in electrical interference between circuits separated by the trench. The trench is made electrically active, and common with the substrate, so that any potential applied to the substrate is also applied to the refill material of the trench. Accordingly, parasitic devices which may lead to an electrical interaction between circuits adjacent each side of the trench are eliminated. Yet another technical advantage of the invention arises from the electrically active nature of the isolating trench, in that topside connections can be made to the trench material. The potential or voltage applied to the topside electrode is transferred by the conductive trench to the underlying substrate, and thus forces the underlying semiconductor substrate material to the same potential. By connecting a desired potential to various locations on the topside of the trench, undesired substrate debiasing effects in high current circuits can be substantially reduced. Many other technical advantages are apparent from the foregoing description and illustrations of the invention.

What is claimed is:

1. A semiconductor circuit comprising:
   a conductive substrate of a first conductivity type material;
   first and second semiconductor areas of a second conductivity type material formed on said substrate;
   a trench separating said first and second semiconductor areas, said trench including electrically isolating sidewalls and a bottom formed in said substrate;
   a conductive material filling said trench and in electrical contact with said substrate; and
   first and second semiconductor devices formed in respective said first and second semiconductor areas.

2. The semiconductor circuit of claim 1 wherein said trench sidewalls include electrical isolation comprising silicon nitride and silicon oxide.

3. The semiconductor circuit of claim 1 wherein said trench conductive material is doped with an impurity of said first conductivity type.

4. The semiconductor circuit of claim 1 wherein one of said semiconductor devices comprises a bipolar transistor and another of said semiconductor devices comprises a field effect transistor.

5. The semiconductor circuit of claim 4 further including a contact electrode formed in electrical contact with said conductive material filling said trench, and said electrode is connected to a ground node of said semiconductor circuit.

6. The semiconductor circuit of claim 1 further including a contact electrode formed in electrical contact with said conductivity material of said trench.

7. The semiconductor circuit of claim 6 further including a reference ground terminal of said semiconductor circuit, and wherein said contact electrode is connected to said ground terminal.

8. The semiconductor circuit of claim 1 wherein said trench is formed in a matrix enclosing a plurality of semiconductor areas.

9. The semiconductor circuit of claim 8 further including a plurality of electrical connections to the conductive material of said trench, said electrical connections being located on a trench surface opposite the connection thereto by said substrate.

10. A method of fabricating a semiconductor circuit with a bipolar transistor isolated from a MOSFET transistor, comprising the steps of:
    forming a layer of semiconductor material of a first conductivity type on a substrate of second conductivity type;
    forming a trench through said layer of semiconductor material into contact with said substrate;
    forming an electrical isolation adjacent the sidewalls of said trench;
    filling said trench with a conductive material of said second conductivity type; and
    forming a bipolar transistor and a MOSFET transistor in said layer of semiconductor material, each said transistor formed on opposing sides of said trench.

11. The method of claim 10 further including forming a heavily doped buried layer of semiconductor material underlying said transistors and disposed between said layer of semiconductor material and said substrate.

12. The method of claim 10 further including forming said transistors with respective semiconductor regions contiguous with the sidewalls of said trench.

13. The method of claim 10 further including forming a semiconductor well of said second conductivity type in said layer of semiconductor material, and forming said MOSFET transistor in said semiconductor well.

14. The method claim 10 further including forming an external electrical contact to said conductive material of said trench.

15. The method of claim 14 further including forming a plurality of electrical contacts to said conductive material.

16. The method of claim 14 further including forming one of said transistor for carrying large currents, and forming said electrical contact to said trench proximate said transistor carrying large currents.

17. A semiconductor structure formed according to the method of claim 10.

18. A method of providing multiple contacts to a substrate of a semiconductor circuit, comprising:
   forming a layer of semiconductor material on said substrate;
   forming a trench matrix through said semiconductor material into contact with said substrate;
   filling said trench matrix with a conductive material which is in electrical contact with said substrate; and
   forming a plurality of electrical contacts to said conductive material at locations remote from said substrate.

19. The method of claim 18 and further including connecting each said electrical contact together, in order to reduce debiasing effects.

20. The method of claim 19 and further including connecting said plurality of contacts to a ground node.

21. The method of claim 18 and further including isolating said conductive material filling said trench matrix from said semiconductor material.

22. The method claim 21 and further including forming two transistor devices in said conductive material and isolated from one another by said trench matrix.

* * * * *